United States Patent
Blake et al.

(10) Patent No.: US 7,993,698 B2
(45) Date of Patent: *Aug. 9, 2011

(54) TECHNIQUES FOR TEMPERATURE CONTROLLED ION IMPLANTATION

(75) Inventors: Julian Blake, Gloucester, MA (US);
Jonathan England, Horsham (GB);
Scott Holden, Melrose, MA (US);
Steven R. Walther, Andover, MA (US);
Reuel Liebert, Peabody, MA (US);
Richard S. Muka, Topsfield, MA (US);
Ukyo Jeong, Eugene, OR (US); Jinning Liu, Andover, MA (US); Kyu-Ha Shim, Andover, MA (US); Sandeep Mehta, Boxford, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 944 days.

This patent is subject to a terminal disclaimer.

(21) Appl. No.: 11/525,878

(22) Filed: Sep. 23, 2006

(65) Prior Publication Data

US 2008/0076194 A1 Mar. 27, 2008

(51) Int. Cl.
*C23C 16/48* (2006.01)
*C23C 16/52* (2006.01)
*C23C 14/48* (2006.01)
*C23C 14/54* (2006.01)
*C23C 14/52* (2006.01)

(52) U.S. Cl. ............... 427/8; 427/9; 427/523; 427/526; 438/14; 438/5; 438/369

(58) Field of Classification Search .................. None
See application file for complete search history.

(56) References Cited

U.S. PATENT DOCUMENTS

| 4,453,080 | A | | 6/1984 | Berkowitz | |
|---|---|---|---|---|---|
| 4,513,384 | A | * | 4/1985 | Rosencwaig | 702/170 |
| 5,126,571 | A | | 6/1992 | Sakai | |
| 5,467,220 | A | * | 11/1995 | Xu | 359/350 |
| 6,084,240 | A | | 7/2000 | Lin et al. | |
| 6,352,591 | B1 | * | 3/2002 | Yieh et al. | 118/697 |
| 6,475,815 | B1 | * | 11/2002 | Nambu et al. | 438/16 |
| 7,016,754 | B2 | * | 3/2006 | Poolla et al. | 700/121 |
| 7,403,834 | B2 | * | 7/2008 | Poolla et al. | 700/121 |
| 7,560,367 | B2 | * | 7/2009 | Kawase et al. | 438/530 |
| 7,655,933 | B2 | * | 2/2010 | England et al. | 250/492.21 |
| 2004/0249604 | A1 | * | 12/2004 | Poolla et al. | 702/182 |

(Continued)

FOREIGN PATENT DOCUMENTS

EP 1189285 A 3/2002

(Continued)

OTHER PUBLICATIONS

Machine translation of JP 09-082267 A.*

(Continued)

*Primary Examiner* — Marianne L Padgett

(57) ABSTRACT

Techniques for temperature-controlled ion implantation are disclosed. In one particular exemplary embodiment, the techniques may be realized as an apparatus for temperature-controlled ion implantation. The apparatus may comprise at least one thermal sensor adapted to measure a temperature of a wafer during an ion implantation process inside an end station of an ion implanter. The apparatus may also comprise a thermal conditioning unit coupled to the end station. The apparatus may further comprise a controller in communication with the thermal sensor and the thermal conditioning unit, wherein the controller compares the measured temperature to a desired wafer temperature and causes the thermal conditioning unit to adjust the temperature of the wafer based upon the comparison.

8 Claims, 7 Drawing Sheets

U.S. PATENT DOCUMENTS

| | | |
|---|---|---|
| 2006/0051884 A1* | 3/2006 | McNamara et al. ............ 438/14 |
| 2006/0089740 A1* | 4/2006 | Poolla et al. .................. 700/109 |
| 2006/0144335 A1* | 7/2006 | Lee et al. ...................... 118/719 |
| 2006/0240651 A1* | 10/2006 | Renau et al. .................. 438/527 |
| 2008/0042078 A1* | 2/2008 | England et al. .......... 250/492.21 |
| 2008/0044257 A1* | 2/2008 | England et al. ............ 414/217.1 |
| 2008/0044938 A1* | 2/2008 | England et al. ................ 438/51 |
| 2010/0155909 A1* | 6/2010 | Ramappa et al. ............. 257/637 |
| 2010/0184250 A1* | 7/2010 | Blake et al. .................... 438/72 |

FOREIGN PATENT DOCUMENTS

| | | |
|---|---|---|
| JP | 09-082267 A * | 3/1997 |
| WO | 03060414 A | 7/2003 |

OTHER PUBLICATIONS

Patent abstracts of Japan for JP 09082267 A, Mar. 28, 1997, Advanced Display KK.

Patent abstracts of Japan for JP 60193249 A, Oct. 1, 1985, Hitachi Ltd.

* cited by examiner

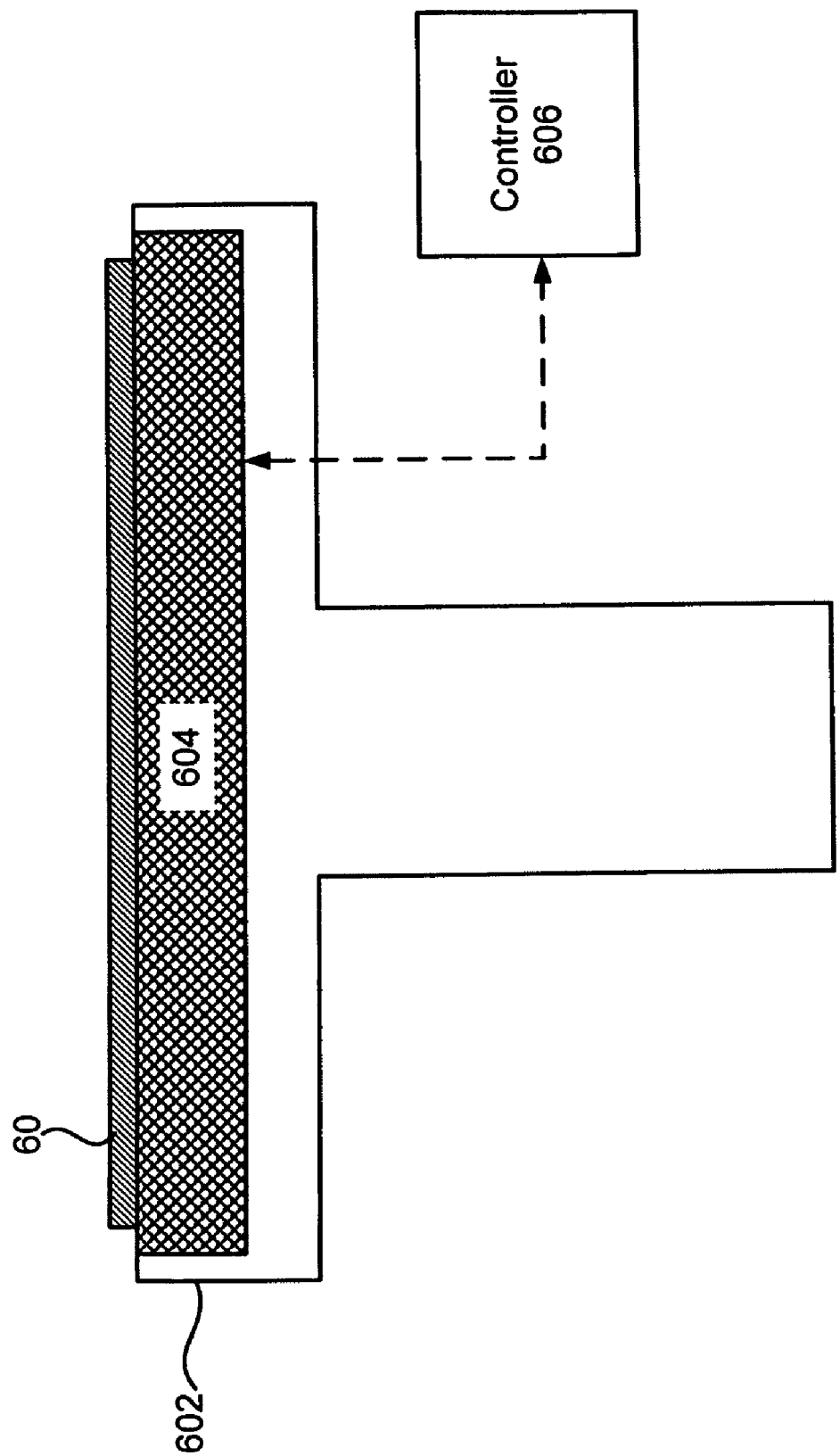

TECHNIQUES FOR TEMPERATURE CONTROLLED ION IMPLANTATION

FIELD OF THE DISCLOSURE

The present disclosure relates generally to semiconductor manufacturing and, more particularly, to techniques for temperature-controlled ion implantation.

BACKGROUND OF THE DISCLOSURE

Ion implantation is a standard technique for introducing impurities into substrates. During an ion implantation process, a desired impurity material is typically ionized in an ion source, the resultant ions are accelerated to form an ion beam of prescribed energy, and the ion beam is then directed at a surface of a substrate, such as a silicon wafer. Constituent ions in the ion beam may be referred to as "beam ions" or "dopant ions."

The beam ions typically penetrate into the target substrate and lose energy by interacting with electrons in the substrate (a mechanism known as "electronic stopping") or by undergoing collisions with the substrate nuclei (a mechanism known as "nuclear stopping"). Electronic stopping can be analogized to a viscous drag on the ions, and does not lead to permanent damages to the substrate's crystal lattice. In contrast, nuclear stopping may lead to the displacement of a substrate atom, leaving a vacancy in the lattice. The displaced atom may become an interstitial, i.e., located at a site between lattice positions of atoms in the substrate's crystal structure. A vacancy-interstitial pair formed when an atom is displaced from a lattice site to an interstitial site is referred to as a "Frenkel pair." One beam ion may undergo many nuclear collisions, and the resulting displaced atoms may themselves have enough energy to undergo their own nuclear collisions and create further displaced atoms, which phenomenon is known as "collision cascade."

When the beam ions and all the displaced atoms have come to a rest, the crystal structure of the substrate will contain primary damages, consisting of vacancies and interstitials. The interstitials tend to be knocked deeper into the substrate by the beam ion collisions, and so the damage associated with the interstitials accumulates at ranges associated with the deepest depth (end of range) attained by the dopant ions. The extent of primary damages formed depends on various characteristics of the ion beam, such as beam energy, ion mass, total implanted dose, and implanted dose rate, and on characteristics of the substrate such as atomic composition, mass and crystal orientation with respect to the ion beam.

Once formed, interstitials and vacancies can diffuse through the substrate. If a vacancy and an interstitial interact, they may recombine, reverting to the original crystal lattice. Alternatively, a vacancy and an interstitial can recombine in such a way as to leave a defect in the lattice. If multiple vacancies, or interstitials, interact with each other, they may form other stable, secondary damage structures. If the damage in a region of the lattice reaches a critical density, the crystal converts into a metastable state, known as amorphous silicon. The diffusivity of the vacancies and interstitials, and therefore rate of damage repair during the ion implantation, are often enhanced as the substrate temperature increases. Substrate temperature is therefore an important parameter that may influence the amount and characteristics of damage remaining after an ion implantation process.

Low-temperature ion implantation has been investigated as a technique for achieving ultra-shallow junctions needed in modern complementary metal-oxide-semiconductor (CMOS) devices. Most low-temperature ion implantation approaches so far have focused on a simplistic goal of lowering wafer temperature as much as possible. There has not been any serious attempt to closely monitor or precisely control wafer temperatures during ion implantation. It is generally considered sufficient if the wafer temperature is below some preset upper limit.

In a production environment it is important that each process step has reproducible results. This applies to the same process (or recipe) carried out over time on a single ion implanter and to the same process carried out on two or more different ion implanters. Until now, controlling parameters such as beam energy, beam current, and beam current density have been sufficient to keep tight enough tolerances on device performance. Wafer temperature and wafer temperature profile have not been treated as critical process parameters. As the critical dimensions of CMOS devices grow smaller, tighter control of ion implantation processes are demanded.

In view of the foregoing, it would be desirable to provide a solution for temperature-controlled ion implantation which overcomes the above-described inadequacies and shortcomings.

SUMMARY OF THE DISCLOSURE

Techniques for temperature-controlled ion implantation are disclosed. In one particular exemplary embodiment, the techniques may be realized as an apparatus for temperature-controlled ion implantation. The apparatus may comprise at least one thermal sensor adapted to measure a temperature of a wafer during an ion implantation process inside an end station of an ion implanter. The apparatus may also comprise a thermal conditioning unit coupled to the end station. The apparatus may further comprise a controller in communication with the thermal sensor and the thermal conditioning unit, wherein the controller compares the measured temperature to a desired wafer temperature and causes the thermal conditioning unit to adjust the temperature of the wafer based upon the comparison.

In accordance with other aspects of this particular exemplary embodiment, the thermal conditioning unit may circulate a coolant. The thermal conditioning unit may adjust the temperature of the wafer by changing a temperature of the coolant or by changing a flow rate of the coolant. The coolant may comprise water, a chillant having a freezing point below 0° C., or a Dynalene heat transfer fluid.

In accordance with further aspects of this particular exemplary embodiment, the thermal conditioning unit may feed a gas to a backside of the wafer, wherein the gas assists in heat exchange between the wafer and a thermal component built in a wafer platen. The thermal conditioning unit may adjust the temperature of the wafer by changing one or more parameters selected from a group consisting of: a pressure associated with the gas, a coolant type associated with the thermal component, a coolant temperature associated with the thermal component, a coolant flow rate associated with the thermal component, and other coolant circulation parameters associated with the thermal component.

In accordance with additional aspects of this particular exemplary embodiment, the thermal conditioning unit may adjust the temperature of the wafer by changing a clamping voltage and/or frequency applied to an electrostatic clamp that holds the wafer.

In accordance with another aspect of this particular exemplary embodiment, the thermal conditioning unit may comprise a cryopump built into a wafer platen, wherein the thermal conditioning unit adjusts the temperature of the wafer by changing an output of the cryopump.

In accordance with yet another aspect of this particular exemplary embodiment, the thermal conditioning unit may comprise at least one Peltier device, wherein the thermal conditioning unit adjusts the temperature of the wafer by changing a voltage applied across the at least one Peltier device. A backside of the wafer may be packed with an array of Peltier device.

In accordance with still another aspect of this particular exemplary embodiment, the at least one thermal sensor may comprise one or more thermocouples. In one variation, at least one of the one or more thermocouples may be coupled to a backside of the wafer. In another variation, at least one of the one or more thermocouples may be coupled to a ground contact of the wafer. In yet another variation, at least one of the one or more thermocouples may be coupled to a front side of the wafer.

In accordance with a further aspect of this particular exemplary embodiment, the at least one thermal sensor may comprise one or more pyrometers. At least one of the one or more pyrometers may be in a fixed position relative to the wafer.

In accordance with yet a further aspect of this particular exemplary embodiment, the at least one thermal sensor may be mounted in the end station and may be gated to measure the temperature of the wafer only when the wafer is in a field of view.

In accordance with still a further aspect of this particular exemplary embodiment, the at least one thermal sensor may be embedded in a carrier plate for the wafer.

According to further aspects of this particular exemplary embodiment, the at least one thermal sensor may communicate with the controller via a wireless link. The ion implantation process may be part of a plasma doping process. The wafer may be attached to a carrier plate to achieve an increased thermal mass.

In another particular exemplary embodiment, the techniques may be realized as a method for temperature-controlled ion implantation. The method may comprise performing a first ion implantation process on a first wafer, the first wafer exhibiting a first temperature profile during the first ion implantation process. The method may also comprise determining, based at least in part on the first temperature profile, a second temperature profile for a second wafer, such that a second ion implantation process on the second wafer produces substantially the same result as the first ion implantation process on the first wafer. The method may further comprise performing the second ion implantation process on the second wafer. The method may additionally comprise monitoring a temperature of the second wafer during the second ion implantation process. The method may further comprise adjusting the temperature of the second wafer to cause the second wafer to exhibit the second temperature profile.

In accordance with other aspects of this particular exemplary embodiment, the first ion implantation process and the second ion implantation process may be performed in a same ion implanter.

In accordance with further aspects of this particular exemplary embodiment, the first ion implantation process and the second ion implantation process may be performed in two different ion-implanters.

In accordance with additional aspects of this particular exemplary embodiment, the second ion implantation process may be different from the first ion implantation process.

In accordance with another aspect of this particular exemplary embodiment, each of the first temperature profile and the second temperature profile may comprise at least an initial wafer temperature at the beginning of the corresponding ion implantation process and a final wafer temperature at the end of the corresponding ion implantation process.

In accordance with yet another aspect of this particular exemplary embodiment, the step of determining the second temperature profile may further comprise performing a plurality of test runs of ion implantation on a sample wafer, each test run causing one portion of the sample wafer to receive ion implantation at a test temperature profile and comparing implant results from the plurality of test runs. At least one test run of ion implantation may be performed by partially scanning the sample wafer. Alternatively, at least one test run of ion implantation may be performed by applying an in-situ process mask to the sample wafer.

In accordance with still another aspect of this particular exemplary embodiment, the method may further comprise attaching the second wafer to a carrier plate to achieve an increased thermal mass.

In yet another particular exemplary embodiment, the techniques may be realized as at least one signal embodied in at least one carrier wave for transmitting a computer program of instructions configured to be readable by at least one processor for instructing the at least one processor to execute a computer process for performing the method as recited above.

In still another particular exemplary embodiment, the techniques may be realized as at least one processor readable carrier for storing a computer program of instructions configured to be readable by at least one processor for instructing the at least one processor to execute a computer process for performing the method as recited above.

In a further particular exemplary embodiment, the techniques may be realized as a method for temperature-controlled ion implantation. The method may comprise measuring a temperature of a wafer in substantial real-time during an ion implantation process. The method may also comprise determining whether the measured temperature falls within a predetermined temperature range. The method may further comprise adjusting the temperature of the wafer if the measured temperature is outside the predetermined temperature range.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 6 shows a block diagram illustrating other exemplary methods for controlling wafer temperature in accordance with an embodiment of the present disclosure.

DETAILED DESCRIPTION OF EXEMPLARY EMBODIMENTS

Embodiments of the present disclosure provide techniques for temperature-controlled ion implantation wherein a wafer temperature is measured and controlled during ion implantation, leading to tighter process control and matching of implanter performance. A wide variety of methods may be employed to closely monitor temperature changes of a wafer during ion implantation, and to adjust cooling and/or heating of the wafer to keep its temperature within preset limits or in compliance with a desired temperature profile.

As used herein, "temperature range" refers to a particular temperature value (e.g., −100° C.) or a range of temperature between an upper limit and a lower limit (e.g., −102° C.~−98° C.).

Figure 1:
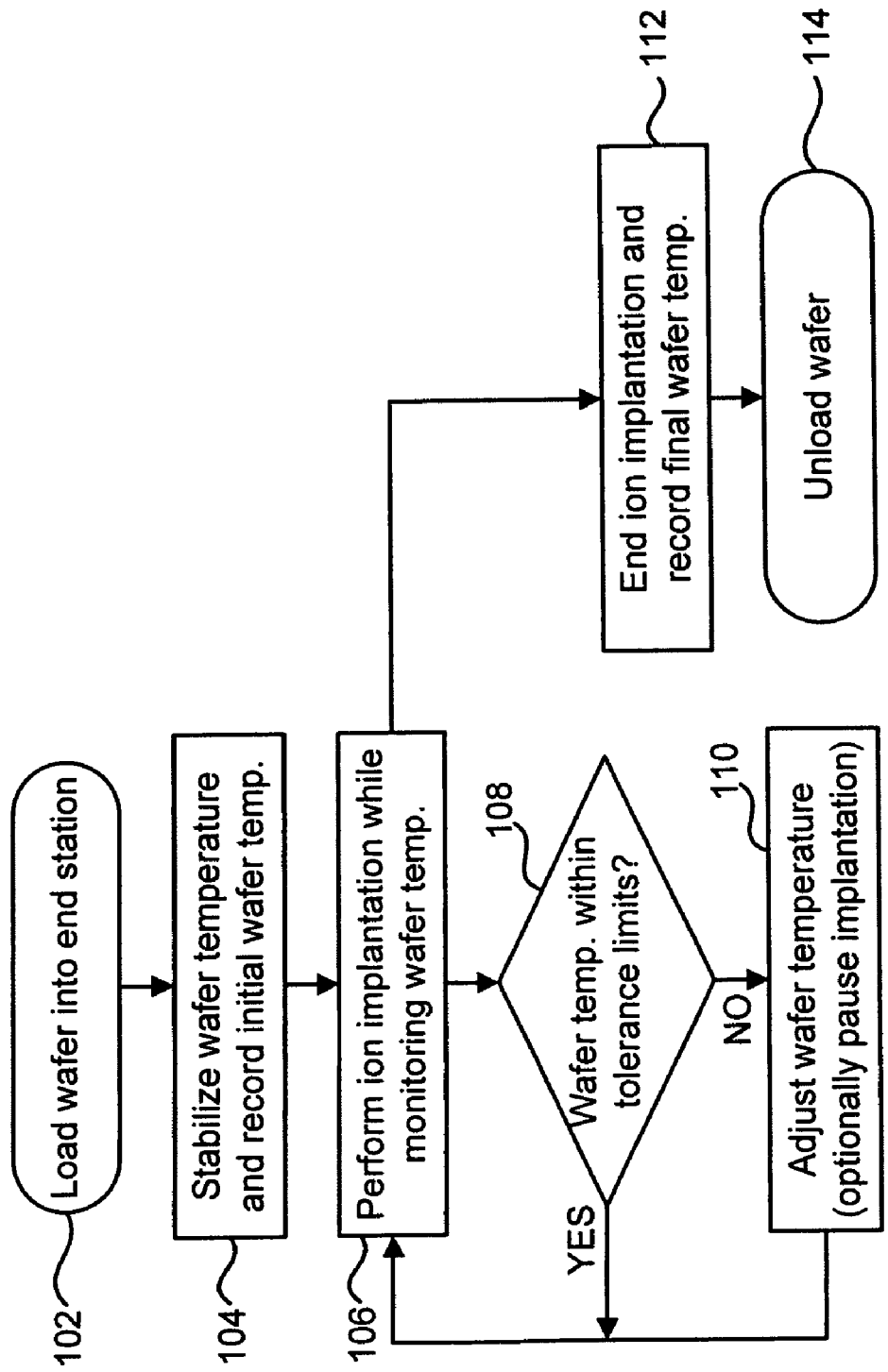
FIG. 1 shows a flow chart illustrating an exemplary method for temperature-controlled ion implantation in accordance with an embodiment of the present disclosure.

Referring to FIG. 1, there is shown a flow chart illustrating an exemplary method for temperature-controlled ion implantation in accordance with an embodiment of the present disclosure.

In step 102, a semiconductor wafer (or other work piece) may be loaded into an end station of an ion implanter. The end station may include an ion implantation process chamber having at least one wafer platen to hold the wafer. The end station may also comprise other typical components, such as, for example, load locks, a wafer orienter, transfer robots, and vacuum parts. In addition, the end station may provide wafer temperature monitoring and controlling capabilities as will be described in detail below. Prior to or during the loading step, the wafer may have been thermally pre-conditioned (e.g., pre-chilled or pre-heated) to a predetermined temperature range.

In step 104, the wafer temperature may be stabilized and an initial wafer temperature may be recorded. It may be desirable to maintain a consistent temperature profile for wafers receiving a same ion implantation recipe at different times and/or in different ion implanters. A "temperature profile" reflects a change of wafer temperature with time during an ion implantation process. For example, the temperature of a wafer may start from −100° C. and may rise (linearly or non-linearly) to −90° C. at the end of the ion implantation process. If such a temperature profile is observed and tolerated in one ion implantation process, the same or similar temperature profile might be desirable for other ion implantation processes running the same recipe on similar wafers such that the implant results may be consistently reproduced. As such, it may be desirable to record at least an initial wafer temperature at the beginning of an ion implantation process and a final wafer temperature at the end of the ion implantation process.

In step 106, an ion implantation may be performed on the wafer while the wafer temperature may be monitored. The wafer temperature may be constantly or periodically measured in substantial real-time during the ion implantation and the measurement may be through a direct contact or contactless means. The real-time temperature measurement data may be recorded to provide a wafer temperature profile.

In step 108, based on the real-time measurement of wafer temperature, it may be determined whether the wafer temperature is within tolerance limits. It is desirable to maintain the wafer temperature at or close to a predetermined value in order to achieve a tight process control. Typically, a temperature range may be specified with an upper tolerance limit and a lower tolerance limit. If the wafer temperature is found to be within the tolerance limits, the ion implantation process may continue (in step 106).

If, however, the wafer temperature is outside the tolerance limits (e.g., above an upper tolerance limit in a low-temperature ion implantation process), the wafer temperature may be immediately adjusted, in step 110, to offset the unwanted temperature change. Optionally, the ion implantation process may be paused until the wafer temperature has been brought back to the desired temperature range. Adjustment of the wafer temperature may be through an in-situ cooling/heating unit. The wafer temperature may be continuously measured to provide a feedback control of temperature adjustment. According to some embodiments, it may be beneficial to over-adjust the wafer temperature to some extent to anticipate a temperature change in the ion implantation process. Once the wafer temperature is within the desired temperature range, the ion implantation process may proceed as normal. Although described here as if in separate steps, the temperature monitoring and adjustment may be a constant and simultaneous processes. According to one embodiment, in order to reduce or minimize temperature changes during the ion implantation, the cooling/heating unit may continuously cool or heat the wafer to offset anticipated temperature changes and maintain a thermal equilibrium.

In step 112, the ion implantation process may come to an end and a final wafer temperature may be recorded to complete the wafer temperature profile. The recorded wafer temperature profile may be used as a basis for wafer temperature control in subsequent ion implantation processes in the same or different ion implanters.

In step 114, the wafer may be unloaded from the end station. It may be desirable to provide post-implant heating or cooling of the wafer to make it safe to unload it from the end station and expose it to atmosphere.

Figure 2:
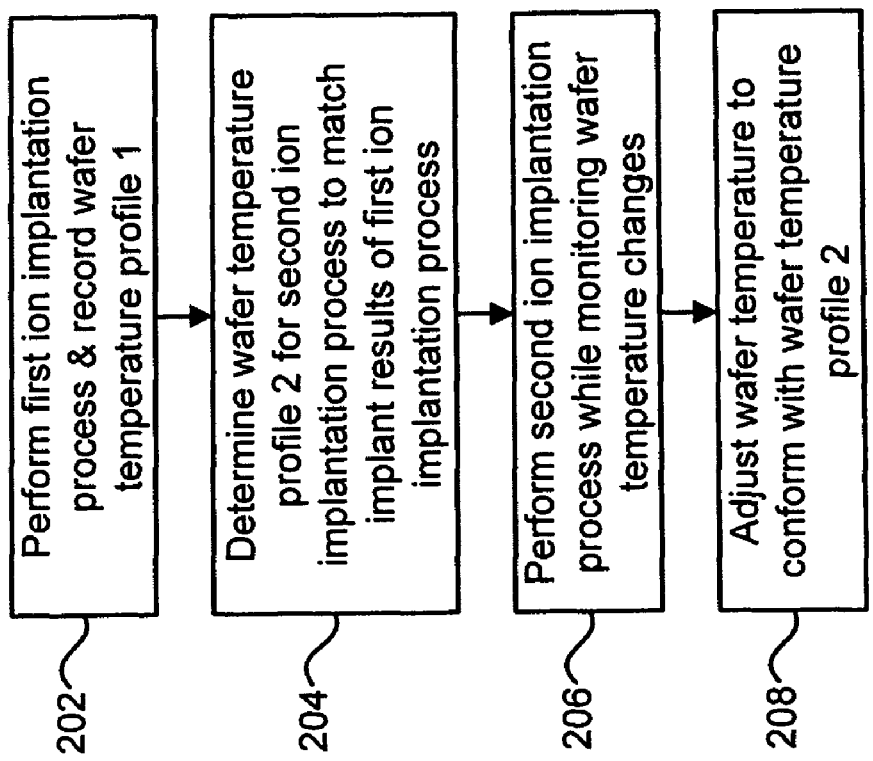
FIG. 2 shows a flow chart illustrating another exemplary method for temperature-controlled ion implantation in accordance with an embodiment of the present disclosure.

FIG. 2 shows a flow chart illustrating another exemplary method for temperature-controlled ion implantation in accordance with an embodiment of the present disclosure. This exemplary method illustrates a basic concept for matching ion implantation processes and tools through wafer temperature control.

In step 202, a first ion implantation process may be performed and a first wafer temperature profile, Profile 1, may be recorded. The Profile 1 may provide a rough or detailed record of temporal changes of the wafer temperature during the first ion implantation process.

In step 204, a second wafer temperature profile, Profile 2, may be determined for a second ion implantation process. The second ion implantation process may be based on a same or similar recipe as the first ion implantation and is intended to produce substantially the same implant results as the first ion implantation process. The second ion implantation process may or may not be carried out on a same ion implanter as the first ion implantation process. To match the implant results between the first and the second ion implantation processes, the crystal damages and/or dopant profiles resulting from these processes may be compared based on computational simulations and/or experimental calibrations. For example, test runs of ion implantation may be performed and sample wafers may be examined for defect density with a transmission electron microscope (TEM) or other diagnostic tools. The wafer temperature profile that produces, during the second ion implantation process, implant results that are closest to the first ion implantation process may be selected as Profile 2.

According to some embodiments of the present disclosure, test runs of ion implantation may be performed on a single sample wafer based on such techniques as partial scans and/or in-situ process mask (IPM). That is, during each test run of ion implantation, only a portion of the sample wafer may receive ion implantation. For example, in a partial scan, an ion beam may be scanned across a designated portion of the sample wafer instead of the entire sample wafer surface. Alternatively, the IPM technique may be employed, wherein a surface of the sample wafer is selectively masked, exposing only a designated portion that is to receive ion implantation. Details on the IPM technique may be found in U.S. patent application Ser. No. 11/329,761, which is incorporated herein in its entirety. The different test runs may be carried out at different wafer temperature conditions. In the end, the entire sample wafer may be subject to a post-implant process, and the different portions of the sample wafer may be inspected to compare their implant results. If a particular portion of the sample wafer exhibits a desired implant result (e.g., dopant profile and/or crystal defects), the wafer temperature profile used for that portion may be selected.

In step 206, the second ion implantation process may be performed on one or more wafers while closely monitoring the wafer temperature changes.

Meanwhile, in step 208, the wafer temperature may be adjusted in real-time to conform with Profile 2.

Figure 3:
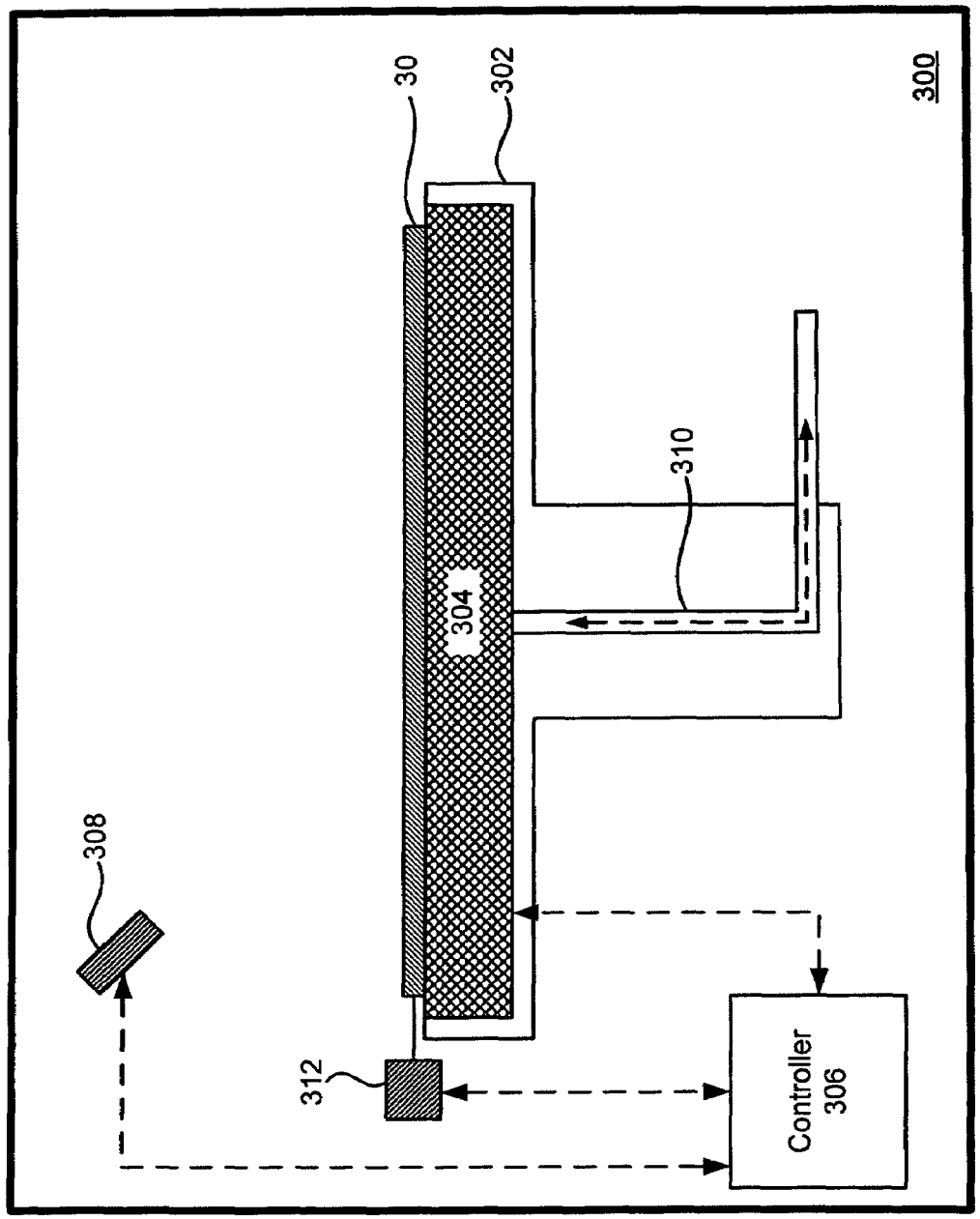
FIG. 3 shows a block diagram illustrating an exemplary system for temperature-controlled ion implantation in accordance with an embodiment of the present disclosure.

FIG. 3 shows a block diagram illustrating an exemplary system 300 for temperature-controlled ion implantation in accordance with an embodiment of the present disclosure. The system 300 may be part of an end station in an ion implanter. A wafer platen 302 may hold a wafer 30 for ion implantation. The wafer platen 302 may comprise a typical electrostatic clamp (ESC) and may facilitate tilting and/or rotation of the wafer 30 during ion implantation. The wafer platen 302 may further comprise a thermal conditioning unit 304 having cooling and/or heating mechanisms to control a temperature of the wafer 30. Although shown here as being completely embedded in the wafer platen 302, specific embodiments of the thermal conditioning unit 304 may vary in size, location and technology. The wafer platen 302 may be further adapted to accommodate pipelines and/or wirings 310 which are needed for the thermal conditioning unit 304.

The system 300 may also comprise one or more temperature measurement devices such as a radiation sensor 308 and/or a thermocouple 312. As an example of contactless temperature measurement, the radiation sensor 308 may detect infrared (IR) radiations and/or other electromagnetic wavelengths emitted from or reflected off a surface of the wafer 30. Based on the detected radiations, a temperature of the wafer 30 may be determined. Emittance of the wafer 30 may vary due to changes in the surface characteristics such as the presence of thin films and surface topology. Accordingly, the radiation sensor 308 may need to be calibrated for different types of wafers and/or thin films. According to some embodiments, to minimize the effect of wafer movement on temperature measurement, it may be desirable to fix the relative position of the radiation sensor 308 with respect to the wafer 30. According to one embodiment of the present disclosure, a radiation pyrometer may be installed inside the end station, and the detection input may be gated to allow temperature measurements only when the wafer 30 is within a field of view. According to another embodiment, the wafer temperature may be detected based on the correlation of the electrical conductivity of the wafer 30 to its temperature. For example, the phase change of an electromagnetic signal reflected off the wafer surface or an optical measurement of carrier density in the wafer may provide a basis for determining the wafer temperature. Alternatively, two piezoelectric transducers in contact with the wafer may be used to measure a phonon velocity within the bulk of the wafer and a wafer temperature may be derived from this measurement. Apart from what is described here, other temperature sensing methods (currently existing or future developed) may also be used.

The thermocouple 312 may be in contact with or attached to a front side or backside of the wafer 30 for direct measurement of the temperature of the wafer 30. Preferably, the thermocouple 312 may be attached to a ground pin of the wafer 30 during ion implantation. Although illustrated in the same drawing, the radiation sensor 308 and the thermocouple 312 may not have to be implemented at the same time.

A controller 306 may be in communication with the one or more temperature measurement devices (e.g., radiation sensor 308 and/or thermocouple 312). The controller 306 may comprise a microprocessor or microcontroller or similar computing device as well as input/output and storage devices. The controller 306 may also be in communication with the thermal conditioning unit 304. Communications with the controller 306 may be via wired, wireless, or optical links. For example, the controller 306 may not have to be located inside the end station, and the temperature measurement devices as well as the thermal conditioning unit 304 may communicate with the controller 306, for example, over radio frequency (RF) data channels.

During ion implantation, the one or more temperature measurement devices may continuously or periodically read a temperature of the wafer 30 and transmit the temperature measurement data to the controller 306. Based on the temperature measurement data, the controller 306 may determine an appropriate action to take in order to regulate the wafer temperature. The controller 306 may transmit control signals to the thermal conditioning unit 304 to adjust a cooling/heating process in response to the wafer temperature changes. The controller 306 may even cause the ion implantation process to be paused if the wafer temperature is out of limits and resume the ion implantation process once a desired temperature has been restored. The controller 306 may also cause the wafer temperature profile to be recorded, and may cause the wafer temperature to be adjusted according to a desired wafer temperature profile.

Figure 4:
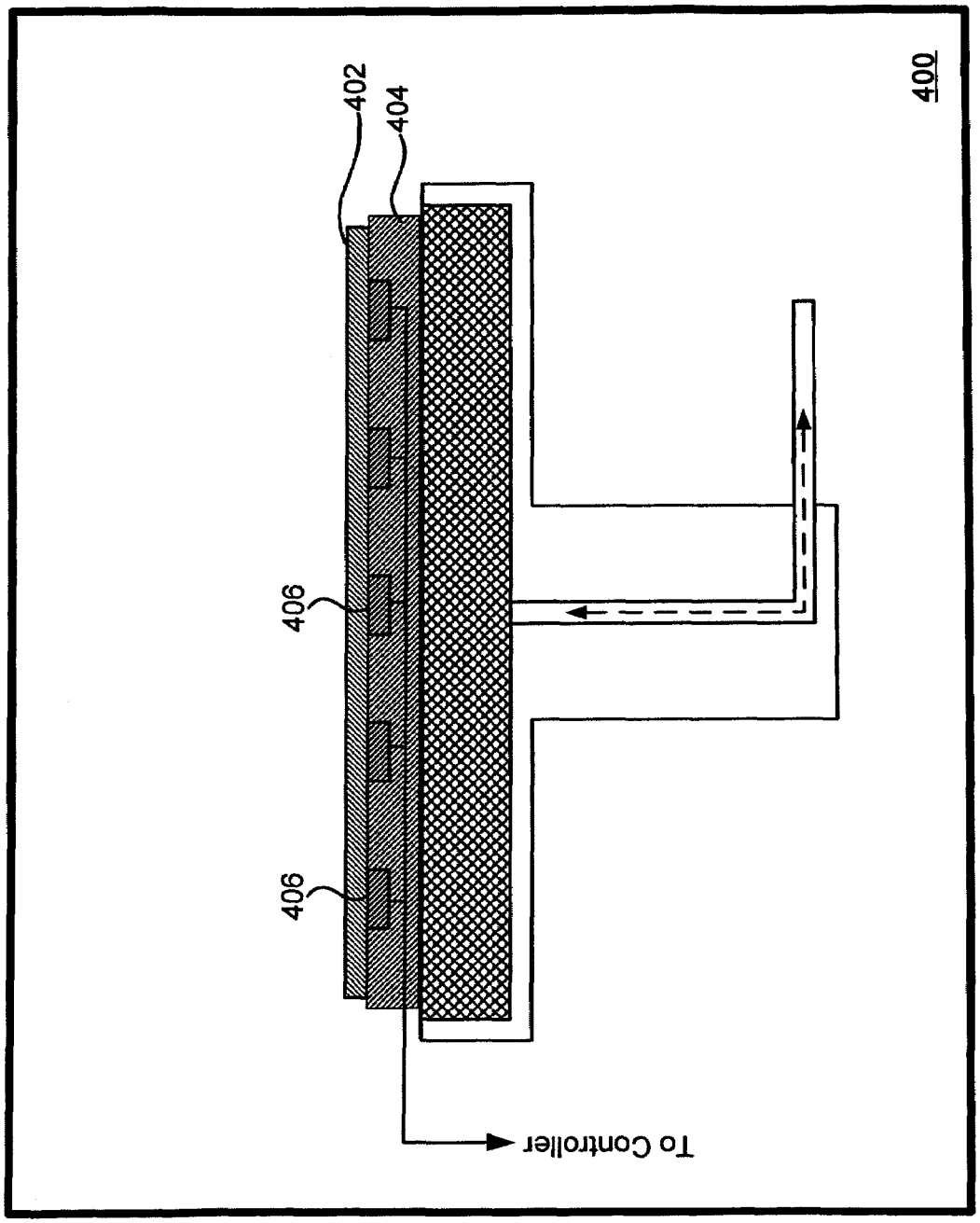
FIG. 4 shows a block diagram illustrating an exemplary method for monitoring wafer temperature in accordance with an embodiment of the present disclosure.

FIG. 4 shows a block diagram illustrating an exemplary method for monitoring wafer temperature in accordance with an embodiment of the present disclosure. In an exemplary system 400 (similar to the system 300), a wafer 402 may have attached to its backside a carrier plate 404. According to embodiments of the present disclosure, in a temperature-controlled ion implantation process, it may be desirable to increase the thermal mass (or heat capacity) of a wafer by attaching it to a heavier carrier plate. As shown here, for example, the carrier plate 404 may be made mostly of metal and may have a surface design compatible with electrostatic clamping. One or more thermal sensors 406 may be embedded in the carrier plate 404 to acquire wafer temperature data and transmit the data to a controller (not shown). The thermal sensors 406 may form an array that is useful not only for measuring spot temperatures but also for determining temperature uniformity across the wafer 402.

Figure 5:
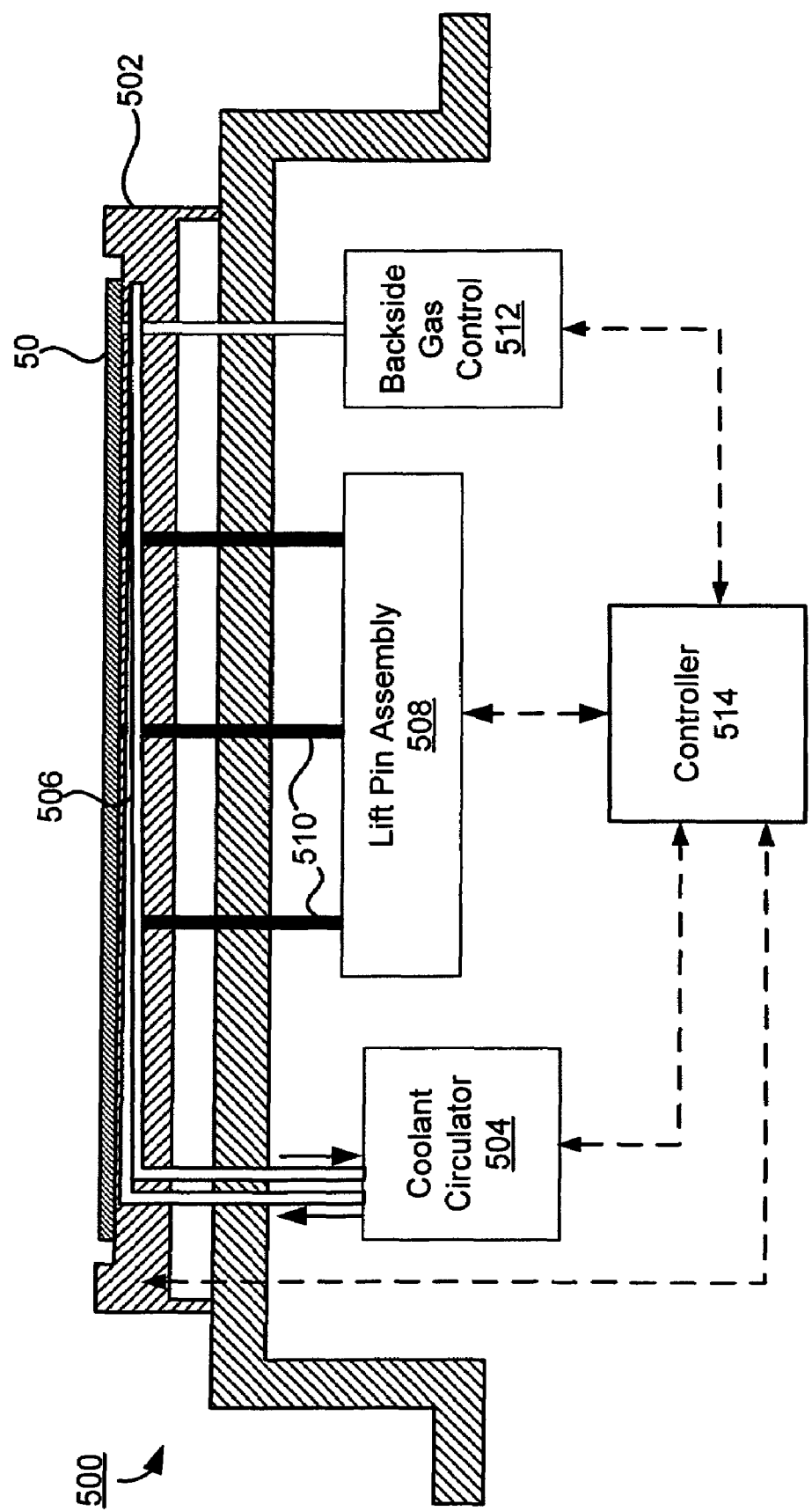
FIG. 5 shows a block diagram illustrating exemplary methods for controlling wafer temperature in accordance with an embodiment of the present disclosure.

FIG. 5 shows a block diagram illustrating exemplary methods for controlling wafer temperature in accordance with an embodiment of the present disclosure. A wafer platen 500 may comprise a stage 502 on top of which a wafer 50 may be electrostatically clamped. The stage 502 may preferably be thermally insulated from other parts of the platen 500. According to one embodiment, the clamping voltage or frequency applied to the ESC may be adjusted to vary the clamping force on the wafer 50, thereby changing thermal conduction between the wafer 50 and the stage 502. Thus, adjustment of the clamping voltage may change the wafer temperature to some extent.

A coolant pipeline 506 may be embedded in the stage 502. A coolant circulator 504 may flow one or more coolants or heat transfer fluids through the coolant pipeline 506 to control a temperature of the wafer 50. The heat exchange rate between the wafer 50 and the coolant pipeline 506 may be adjusted by varying coolant temperature and/or coolant flow rate. A typical coolant may be water although its cooling capability is limited by its freezing point. For lower-temperature ion implantation, it may be desirable to select a coolant with a freezing point well below 0° C. Another common coolant may be liquid nitrogen ($LN_2$). According to one embodiment, one or more heat transfer fluids that are commercially available under the brand name Dynalene® may be used, although other brands or types of coolants or heat transfer fluids may also be selected based on specific cooling/heating needs. According to another embodiment, the coolant circulator 504 may also take advantage of the phase change of a coolant (e.g., ammonia $NH_3$) to cool the wafer 50 consistently to approximately the same temperature.

A backside gas control unit 512 may be coupled to the stage 502 to control a gas supply (e.g., nitrogen) to the backside of the wafer 50. The backside gas may assist in controlling the wafer temperature since the gas pressure may be varied to affect heat transfers to and from the wafer 50. A thermal component such as a heat sink, a heat source, and/or coolant circulation pipes may be built in the wafer platen 500, and the backside gas may assist in heat exchange between the wafer 50 and the thermal component. According to some embodiment, the backside gas assisted heating/cooling may be a preferred method for controlling the wafer temperature. In particular, it may be desirable to adjust the wafer temperature by modulating the backside gas pressure in combination with the coolant circulation parameters (e.g., coolant type, temperature, flow rate, and/or any other parameter).

Similar to a typical modern wafer platen, the wafer platen 500 may further comprise a lift pin assembly 508 that controls a set of lift pins 510. The lift pin assembly 508 may cause the lift pins 510 to keep the wafer 50 in a wafer transfer plane during loading and unloading by robotic arms.

Although illustrated here in a single drawing, the different wafer temperature control mechanisms need not be implemented together. When present, the various mechanisms may be coupled to a controller 514, for example, for feedback control.

FIG. 6 shows a block diagram illustrating another exemplary method for controlling wafer temperature in accordance with an embodiment of the present disclosure. In this example, a wafer 60 may be placed on a wafer platen 602 during ion implantation. The wafer platen 602 may comprise a built-in chiller head 604 to control the wafer temperature. The chiller head 604 may be coupled to a cryopump (not shown) in communication with a controller 606. According to one embodiment, a Polycold® PGCL closed loop gas chiller (available from Helix Technology Corp., Petaluma, Calif., USA) may be used to cool the wafer 60.

Figure 7B:
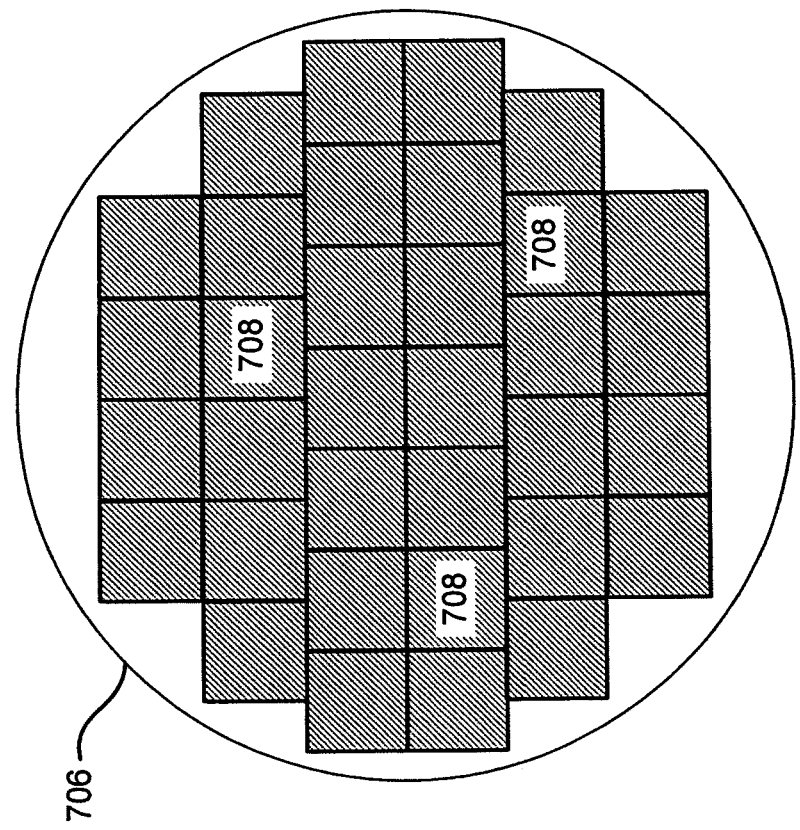
FIGS. 7a and 7b show exemplary methods for controlling wafer temperature with Peltier devices in accordance with an embodiment of the present disclosure.
Figure 7A:
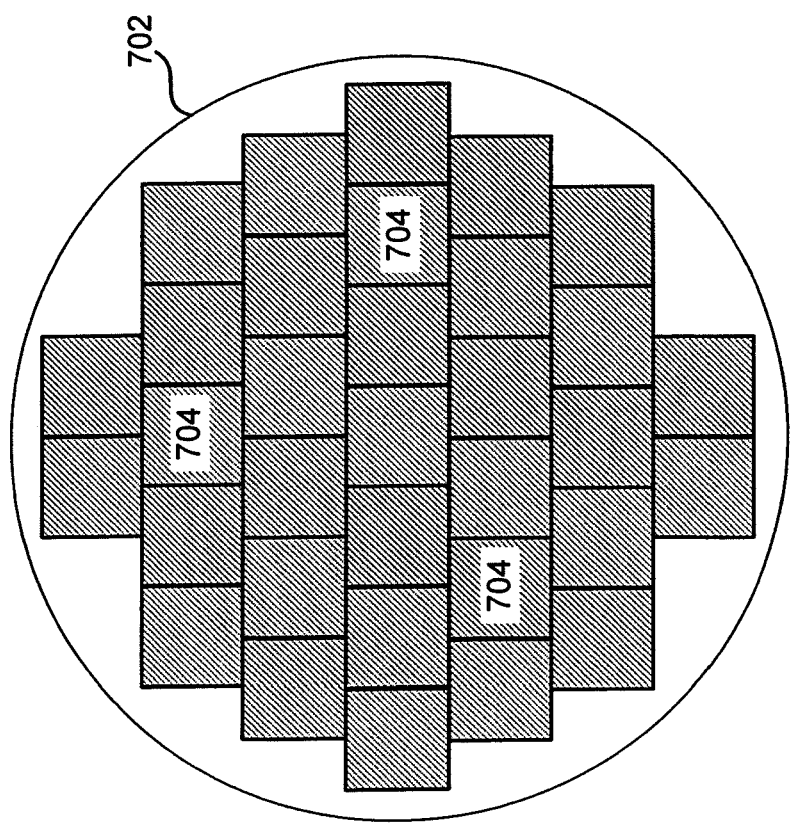

FIGS. 7*a* and 7*b* show exemplary methods for controlling wafer temperature with Peltier devices in accordance with an embodiment of the present disclosure. Peltier devices, also know as thermoelectric (TE) modules, are typically smaller solid-state devices that can function as heat pumps. Since a Peltier device has no moving parts, can be easily controlled by varying an applied voltage, and can be switched between heating and cooling, the use of Peltier devices may be a preferred approach for wafer temperature control. Multiple Peltier devices may be packed onto a wafer platen as shown in FIGS. 7*a* and 7*b*. FIG. 7*a* shows 33 identical Peltier devices (704) arranged on a wafer platen 702. FIG. 7*b* shows 34 identical Peltier devices (708) arranged on a wafer platen 706. Other device sizes and packing patterns may be selected. In addition, since a single layer of Peltier devices may not have sufficient heating or cooling capabilities, multiple Peltier devices may be stacked in series to achieve higher or lower wafer temperatures. For fine adjustment of wafer temperature, a single layer of Peltier devices may be sufficient. If the Peltier devices are in a cooling mode, a heat sink (not shown) and a coolant circulation system (not shown) may be provided to remove excess heat from one side of the Peltier devices.

The above-described methods for measuring and/or controlling wafer temperature may be implemented in various combinations as may be appreciated by those skilled in the art.

At this point it should be noted that the technique for temperature-controlled ion implantation in accordance with the present disclosure as described above typically involves the processing of input data and the generation of output data to some extent. This input data processing and output data generation may be implemented in hardware or software. For example, specific electronic components may be employed in an ion implanter or similar or related circuitry for implementing the functions associated with temperature-controlled ion implantation in accordance with the present disclosure as described above. Alternatively, one or more computers or processors operating in accordance with stored instructions may implement the functions associated with temperature-controlled ion implantation in accordance with the present disclosure as described above. If such is the case, it is within the scope of the present disclosure that such instructions may be stored on one or more processor-readable or computer-readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method for temperature-controlled ion implantation, the method comprising the steps of:
    performing a first ion implantation process on a first wafer;
    recording a first temperature profile during the first ion implantation process, the first temperature profile representative of a change in temperature of the first wafer over time from a start time to an end time of the first ion implantation process;
    measuring a first dopant profile of the first wafer resulting from the first ion implantation process;
    determining, based on the first temperature profile and the first dopant profile, a second variable temperature profile for a second wafer, the second variable temperature profile representative of a non-zero change in temperature of the second wafer over time from a start time to an end time of a second ion implantation process, such that the second ion implantation process on the second wafer produces a second dopant profile of the second wafer substantially similar to the first dopant profile;
    performing the second ion implantation process on the second wafer;
    monitoring a temperature of the second wafer during the second ion implantation process; and
    adjusting the temperature of the second wafer to cause the second wafer to exhibit the second temperature profile.

2. The method according to claim 1, wherein the first ion implantation process and the second ion implantation process are performed in a same ion implanter.

3. The method according to claim 1, wherein the first ion implantation process and the second ion implantation process are performed in two different ion implanters.

4. The method according to claim 1, wherein the step of determining the second variable temperature profile further comprises:
    performing a plurality of test runs of ion implantation on a sample wafer, each test run causing a separate portion of a front surface of the sample wafer to receive ion implantation at a test temperature profile; and
    comparing implant results from the plurality of test runs.

5. The method according to claim 4, wherein at least one test run of ion implantation is performed by partially scanning the sample wafer with respect to an ion beam.

6. The method according to claim 4, wherein at least one test run of ion implantation is performed by applying an in-situ process mask to the sample wafer.

7. The method according to claim 1, further comprising:
    attaching the second wafer to a carrier plate to achieve an increased thermal mass during the second ion implantation process.

8. The method according to claim 1, wherein the step of determining the second variable temperature profile further comprises:
    performing a plurality of test runs of ion implantation on a sample wafer, each test run causing a separate portion of a front surface of the sample wafer to receive ion implantation at a test temperature profile;
    measuring a dopant profile of each portion of the test wafer;
    comparing the dopant profile of each portion to the first dopant profile;
    selecting the dopant profile from a selected portion of the sample wafer that most closely resembles the first dopant profile; and
    selecting the test temperature profile of the selected portion as the second variable temperature profile.

* * * * *